US011948821B2

(12) United States Patent
Matsutori

(10) Patent No.: US 11,948,821 B2
(45) Date of Patent: Apr. 2, 2024

(54) SUBSTRATE STORING CONTAINER

(71) Applicant: MIRAIAL CO., LTD., Tokyo (JP)

(72) Inventor: Chiaki Matsutori, Tokyo (JP)

(73) Assignee: MIRAIAL CO., LTD., Tokyo (JP)

( * ) Notice: Subject to any disclaimer, the term of this patent is extended or adjusted under 35 U.S.C. 154(b) by 723 days.

(21) Appl. No.: 17/050,374

(22) PCT Filed: Apr. 25, 2018

(86) PCT No.: PCT/JP2018/016821
§ 371 (c)(1),
(2) Date: Oct. 23, 2020

(87) PCT Pub. No.: WO2019/207690
PCT Pub. Date: Oct. 31, 2019

(65) Prior Publication Data
US 2021/0118713 A1    Apr. 22, 2021

(51) Int. Cl.
*H01L 21/673* (2006.01)
(52) U.S. Cl.
CPC .............................. *H01L 21/67389* (2013.01)
(58) Field of Classification Search
CPC ......... H01L 21/67389; H01L 21/67386; H01L 21/67393; H01L 21/67383; H01L 21/67376
USPC ................................................. 206/710–712
See application file for complete search history.

(56) References Cited

U.S. PATENT DOCUMENTS

| | | | |
|---|---|---|---|
| 8,783,463 B2 * | 7/2014 | Watson | H01L 21/67393 206/454 |
| 10,580,675 B2 * | 3/2020 | Woo | H01L 21/67393 |
| 10,607,871 B2 * | 3/2020 | Chiu | G03F 7/70741 |
| 2015/0041360 A1 * | 2/2015 | Watson | H01L 21/67393 206/711 |
| 2016/0276190 A1 | 9/2016 | Smith et al. | |
| 2017/0271188 A1 * | 9/2017 | Fuller | H01L 21/67393 |
| 2018/0247849 A1 * | 8/2018 | Glavan | H01L 21/67376 |
| 2019/0393063 A1 * | 12/2019 | Matsutori | H01L 21/67389 |
| 2020/0020549 A1 * | 1/2020 | Ogawa | H01L 21/6732 |

FOREIGN PATENT DOCUMENTS

| | | |
|---|---|---|
| JP | 2010135387 A | 6/2010 |
| JP | 2010270823 A | 12/2010 |
| JP | 2012114133 A | 6/2012 |
| JP | 5524093 B2 | 6/2014 |

(Continued)

*Primary Examiner* — Robert Poon
(74) *Attorney, Agent, or Firm* — Muncy, Geissler, Olds & Lowe, P.C.

(57) ABSTRACT

A substrate storing container includes: a container main body including a tubular wall portion, the container main body having a substrate storing space which is formed by an inner face of the wall portion, is able to store a plurality of substrates, and communicates with the container main body opening portion; a lid body which is removably attached to the container main body opening portion and is able to close the container main body opening portion; a ventilation passage which allows the substrate storing space and an external space of the container main body to communicate with each other, wherein the ventilation passage is formed in a ventilation passage forming unit which is insert-molded with the container main body.

2 Claims, 11 Drawing Sheets

(56) References Cited

FOREIGN PATENT DOCUMENTS

| | | |
|---|---|---|
| JP | 2016015421 A | 1/2016 |
| JP | 2016119327 A | 6/2016 |
| JP | 2016538732 A | 12/2016 |
| JP | 6057716 B2 | 1/2017 |
| JP | 2017050494 A | 3/2017 |
| JP | 6271354 B | 1/2018 |
| KR | 20160068937 A | 6/2016 |
| WO | WO-2011072260 A2 | 6/2011 |
| WO | WO-2015057739 A1 | 4/2015 |
| WO | WO2016135952 | 1/2016 |
| WO | WO-2017/040913 A1 | 3/2017 |
| WO | WO-2009114798 A2 | 9/2019 |

\* cited by examiner

SUBSTRATE STORING CONTAINER

TECHNICAL FIELD

The present invention relates to a substrate storing container used to store, keep, convey, and transport a substrate made of a semiconductor wafer and other components.

BACKGROUND ART

As a substrate storing container that stores and transports substrates made of semiconductor wafers during in-factory processes, a container including a container main body and a lid body has been known (see, e.g., Patent Documents 1 to 4).

The container main body has, at one end portion thereof, an opening peripheral portion at which a container main body opening portion is formed. The other end portion of the container main body is closed to form a tubular wall portion. A substrate storing space is formed in the container main body. The substrate storing space is formed to be surrounded by the wall portion, and can store a plurality of substrates. A lid body is removably attached to the opening peripheral portion, and can close the container main body opening portion. Lateral substrate support portions are provided at the wall portion so as to form a pair in the substrate storing space. When the container main body opening portion is not closed by the lid body, the lateral substrate support portions can support edge portions of the plurality of substrates in a state in which adjacent substrates are arranged in parallel to be spaced apart by a predetermined interval.

A front retainer is provided for a portion of the lid body which faces the substrate storing space when the lid body closes the container main body opening portion. The front retainer can support the edge portions of the plurality of substrates when the container main body opening portion is closed by the lid body. A back side substrate support portion is arranged on the wall portion to form a pair with the front retainer. The back side substrate support portion can support the edge portions of the plurality of substrates. When the container main body opening portion is closed by the lid body, the back side substrate support portion supports the plurality of substrates in cooperation with the front retainer to retain the plurality of substrates in a state in which adjacent substrates are arranged in parallel to be spaced apart by a predetermined interval.

Patent Document 1: Japanese Unexamined Patent Application (Translation of PCT Application), Publication No. 2016-538732
Patent Document 2: Japanese Patent No. 5524093
Patent Document 3: Japanese Patent No. 6057716
Patent Document 4: Japanese Patent No. 6271354

DISCLOSURE OF THE INVENTION

Problems to be Solved by the Invention

The conventional substrate storing container has a ventilation passage that allows the substrate storing space and an external space of the container main body to communicate with each other. Through the ventilation passage, dry air (will be hereinafter referred to as "purge gas") from which inert gas such as nitrogen or moisture has been removed (to 1% or less) is introduced from the outside of the container main body into the substrate storing space. Thus, gas purging is performed.

However, in a commercially available load port, i.e., a device that positions the container main body and sends the purge gas to a scavenging port formed in an outer face of the container main body and communicating with the ventilation passage, a gas inlet which is connected to the scavenging port to introduce the purge gas is fixed to a predetermined position. Thus, the scavenging port of the container main body needs to be positioned to face the gas inlet from above in a vertical direction.

The gas introduced from the gas inlet passes through the scavenging port of the container main body, and is discharged from a gas outlet formed in an inner face of the container and positioned vertically above the gas inlet. In some cases, the gas outlet is formed at a position vertically below the substrates stored in the substrate storing space (at a position vertically overlapping with the substrates stored in the substrate storing space). In such a case, even if the lid body closes the container main body opening portion of the substrate storing container to block the substrate storing space from outside air, replacement of gas present in gaps between the substrates generally stored in plural number is very inefficient. The gas purging may be performed even when the container main body opening portion of the substrate storing container is not closed by the lid body and is open. However, in this case, the purge gas does not reach the gaps between the substrates stored in plural number, making the replacement of the gas by the gas purging impossible.

Further, even when an attempt is made to retrofit a component that allows the purge gas to flow into the gaps between the substrates stored in plural number onto the outer or inner face of the container main body, a large burden is imposed on the assembling due to narrow design widths under severe dimensional constraint, or a complex structure including an O-ring and any other components.

An object of the present invention is to provide a substrate storing container which allows a simply configured component for introducing the purge gas into the gaps between the substrates stored in plural number to be easily retrofitted to the container main body.

Means for Solving the Problems

The present invention relates to a substrate storing container, including: a container main body including a tubular wall portion having at one end portion thereof an opening peripheral portion at which a container main body opening portion is formed, and the other end portion closed, the container main body having a substrate storing space which is formed by an inner face of the wall portion, is able to store a plurality of substrates, and communicates with the container main body opening portion; a lid body which is removably attached to the container main body opening portion and is able to close the container main body opening portion; and a ventilation passage which allows the substrate storing space and an external space of the container main body to communicate with each other, wherein the ventilation passage is formed in a ventilation passage forming unit which is insert-molded with the container main body.

The ventilation passage forming unit preferably includes at least one air passage. Further, the ventilation passage forming unit is preferably an assembly of a plurality of components.

The ventilation passage forming unit preferably includes a first component which forms a portion through which gas flows into the ventilation passage in the ventilation passage forming unit; and a second component with which the gas that has flowed into the ventilation passage of the ventilation passage forming unit collides to change a flow direction of the gas. The additional component is preferably removably attachable to the ventilation passage forming unit.

Effects of the Invention

The present invention can provide a substrate storing container which allows a simply configured component for introducing the purge gas into the gaps between the substrates stored in plural number to be easily retrofitted to the container main body.

PREFERRED MODE FOR CARRYING OUT THE INVENTION

Figure 2:
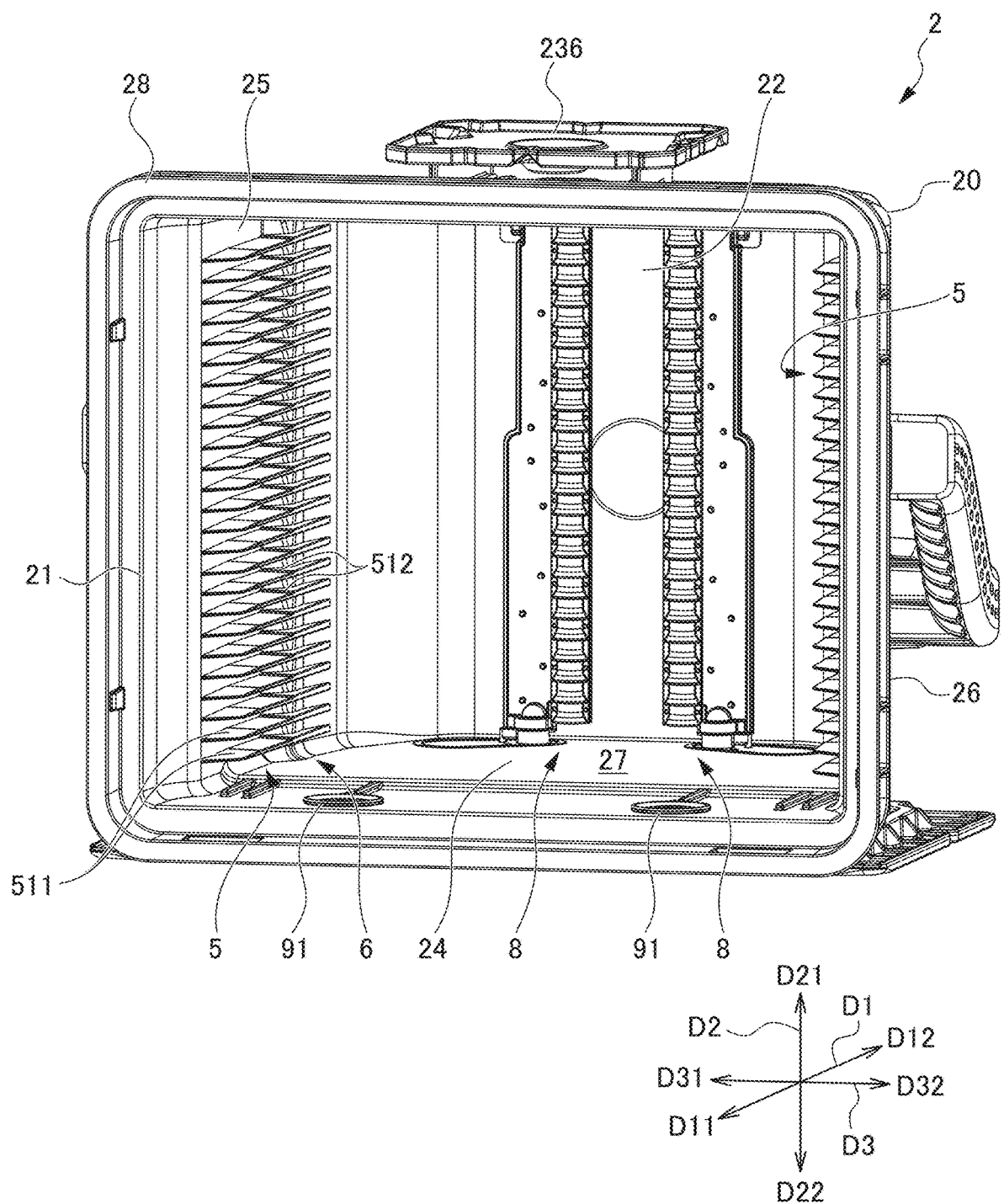
FIG. 2 is a perspective view illustrating a container main body 2 of the substrate storing container 1 of the embodiment of the present invention as seen from above.
Figure 3:
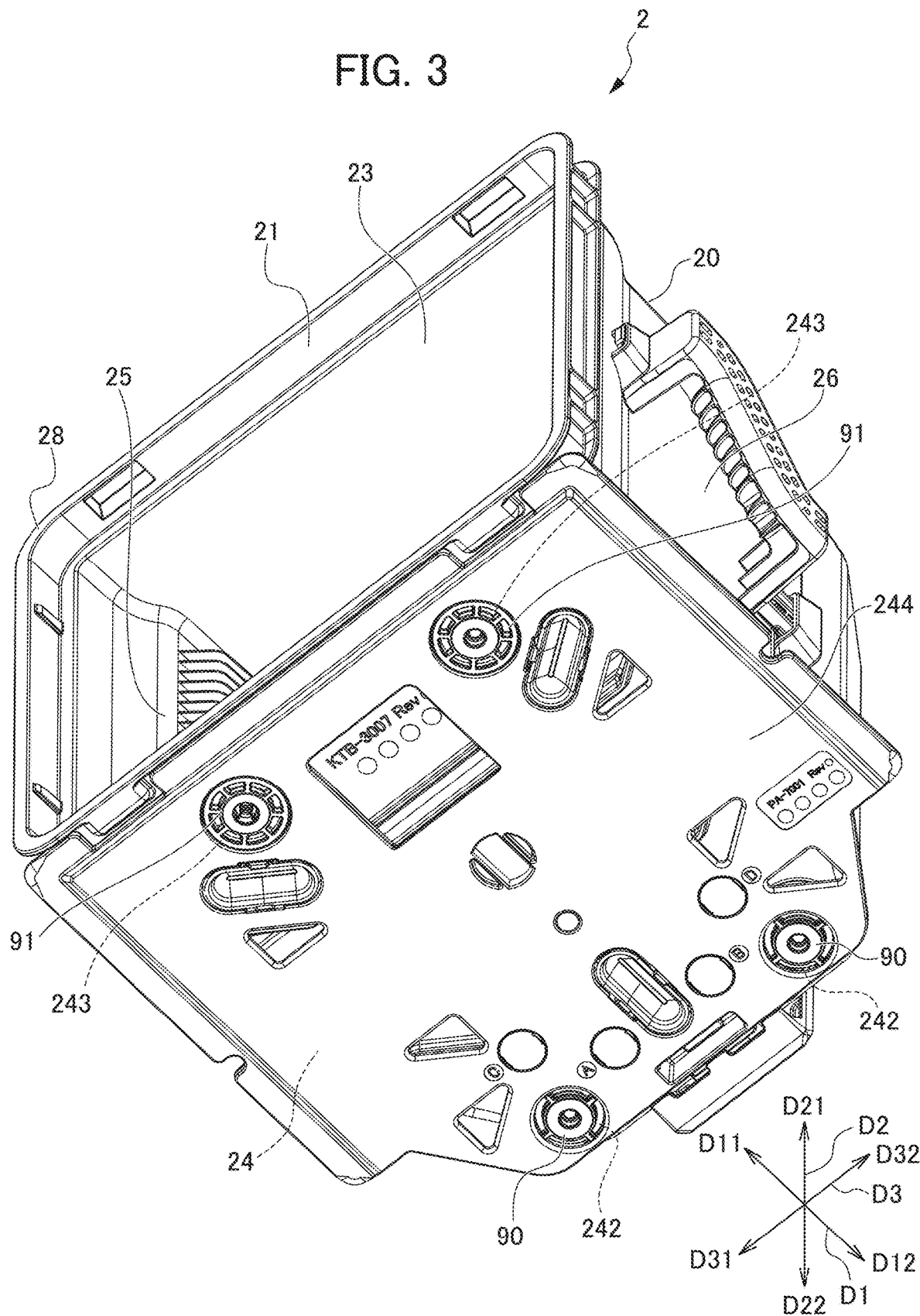
FIG. 3 is a perspective view illustrating the container main body 2 of the substrate storing container 1 of the embodiment of the present invention as seen from below.
Figure 4:
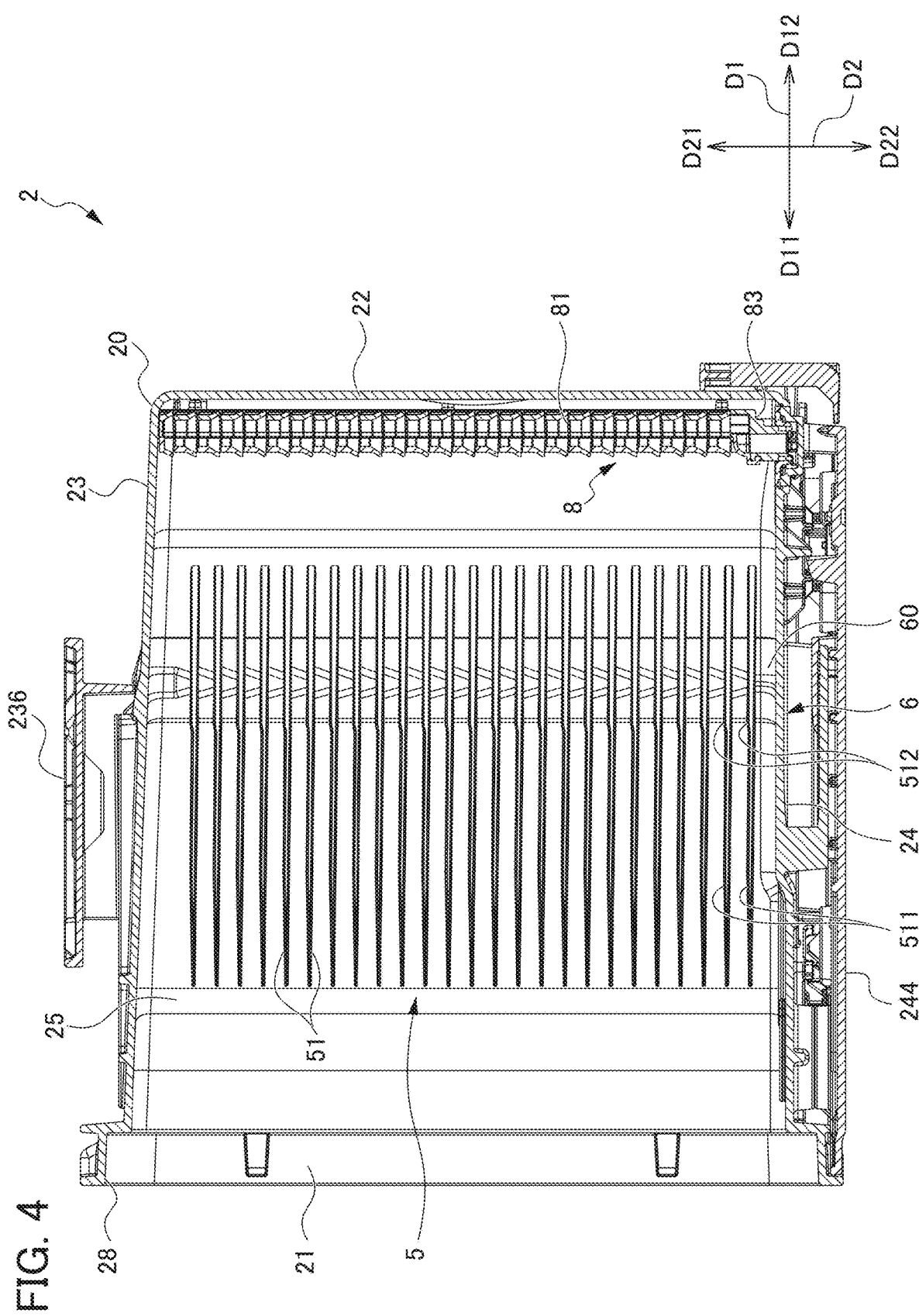
FIG. 4 is a sectional side view illustrating the container main body 2 of the substrate storing container 1 of the embodiment of the present invention.

A substrate storing container 1 of the present embodiment will be described with reference to the drawings. FIG. 2 is a perspective view illustrating a container main body 2 of the substrate storing container 1 as seen from above. FIG. 3 is a perspective view illustrating the container main body 2 of the substrate storing container 1 as seen from below. FIG. 4 is a sectional side view illustrating the container main body 2 of the substrate storing container 1.

For explanatory convenience, a direction from the container main body 2 to a lid body 3 to be described later (a direction from the upper right to the lower left in FIG. 1) is defined as a forward direction D11, a direction opposite to D11 is defined as a backward direction D12, and these directions are collectively defined as a front-back direction D1. A direction from a lower wall 24 to an upper wall 23 to be described later (an upward direction in FIG. 1) is defined as an upward direction D21, a direction opposite to D21 is defined as a downward direction D22, and these directions are collectively defined as a vertical direction D2. Further, a direction from a second side wall 26 to a first side wall 25 to be described later (a direction from the lower right to the upper left in FIG. 1) is defined as a left direction D31, a direction opposite to D31 is defined as D32, and these directions are collectively defined as a left-right direction D3. Arrows indicating these directions are shown in major drawings.

A substrate W (see FIG. 1) stored in the substrate storing container 1 is a disc-like silicon wafer, glass wafer, sapphire wafer, etc., and is a thin member used in industry. The substrate W of the present embodiment is a silicon wafer having a diameter of 300 mm.

Figure 1:
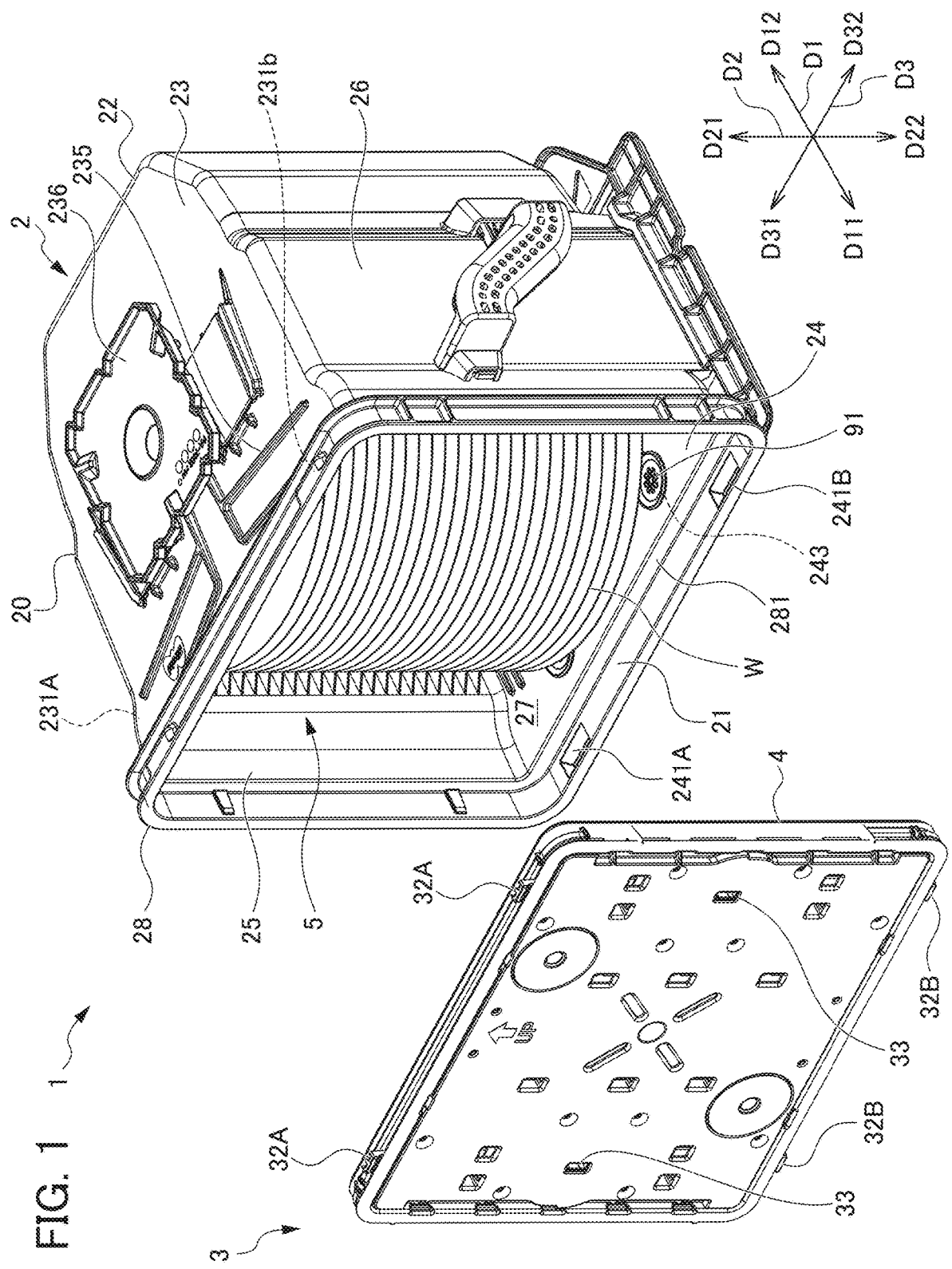
FIG. 1 is an exploded perspective view illustrating a plurality of substrates W stored in a substrate storing container 1 of an embodiment of the present invention.

As illustrated in FIG. 1, the substrate storing container 1 is used as an in-process container that stores and transports the substrate W which is a silicon wafer as described above during the processes in a factory, or a shipping container used to transport the substrate by transportation such as land, air, or marine transportation. The substrate storing container 1 includes a container main body 2 and a lid body 3. The container main body 2 includes substrate support plate-like portions 5 serving as lateral substrate support portions, and a back side substrate support portion 6 (see FIG. 2). The lid body 3 includes a front retainer (not illustrated) serving as a lid body side substrate support portion.

The container main body 2 includes a tubular wall portion 20 having at one end portion thereof a container main body opening portion 21, and the other end portion closed. A substrate storing space 27 is formed in the container main body 2. The substrate storing space 27 is formed to be surrounded by the wall portion 20. The substrate support plate-like portions 5 are disposed at a portion of the wall portion 20 forming the substrate storing space 27. A plurality of substrates W can be stored in the substrate storing space 27 as illustrated in FIG. 1.

The substrate support plate-like portions 5 are provided at the wall portion 20 so as to form a pair in the substrate storing space 27. When the container main body opening portion 21 is not closed by the lid body 3, the substrate support plate-like portions 5 abut on the edge portions of the plurality of substrates W to be able to support edge portions of the plurality of substrates W in a state in which adjacent substrates W are arranged in parallel to be spaced apart by a predetermined interval. The back side substrate support portion 6 is integrally molded with the substrate support plate-like portions 5 at a back side of the substrate support plate-like portions 5.

The back side substrate support portion 6 (see FIG. 2) is provided on the wall portion 20 in the substrate storing space 27 to form a pair with a front retainer (not illustrated) which will be described later. When the container main body opening portion 21 is closed by the lid body 3, the back side substrate support portion 6 abuts on the edge portions of the plurality of substrates W to be able to support rear portions of the edge portions of the plurality of substrates W.

The lid body 3 can be removably attached to an opening peripheral portion 28 (see FIG. 1 and other drawings) forming the container main body opening portion 21, and can close the container main body opening portion 21. A front retainer (not illustrated) is provided for a portion of the lid body 3 which faces the substrate storing space 27 when the container main body opening portion 21 is closed by the lid body 3. The front retainer (not illustrated) is arranged so as to form a pair with the back side substrate support portion 6 inside the substrate storing space 27.

When the container main body opening portion 21 is closed by the lid body 3, the front retainer (not illustrated) abuts on the edge portions of the plurality of substrates W to be able to support front portions of the edge portions of the plurality of substrates W. When the container main body opening portion 21 is closed by the lid body 3, the front retainer (not illustrated) supports the plurality of substrates W in cooperation with the back side substrate support portion 6 to retain the plurality of substrates W in a state in which adjacent substrates W are arranged in parallel to be spaced apart by a predetermined interval.

The substrate storing container 1 is made of a resin such as plastic. Unless otherwise specified, the substrate storing container 1 may be made of resins, e.g., thermoplastic resins such as polycarbonate, cycloolefin polymer, polyether imide, polyether ketone, polybutylene terephthalate, polyether ether ketone, and liquid crystal polymer, and alloys of them. When these resins used as a molding material require conductivity, a conductive substance such as carbon fibers, carbon powder, carbon nanotubes, and conductive polymer may be selectively added. Glass fibers or carbon fibers may be added to improve rigidity.

Figure 5:
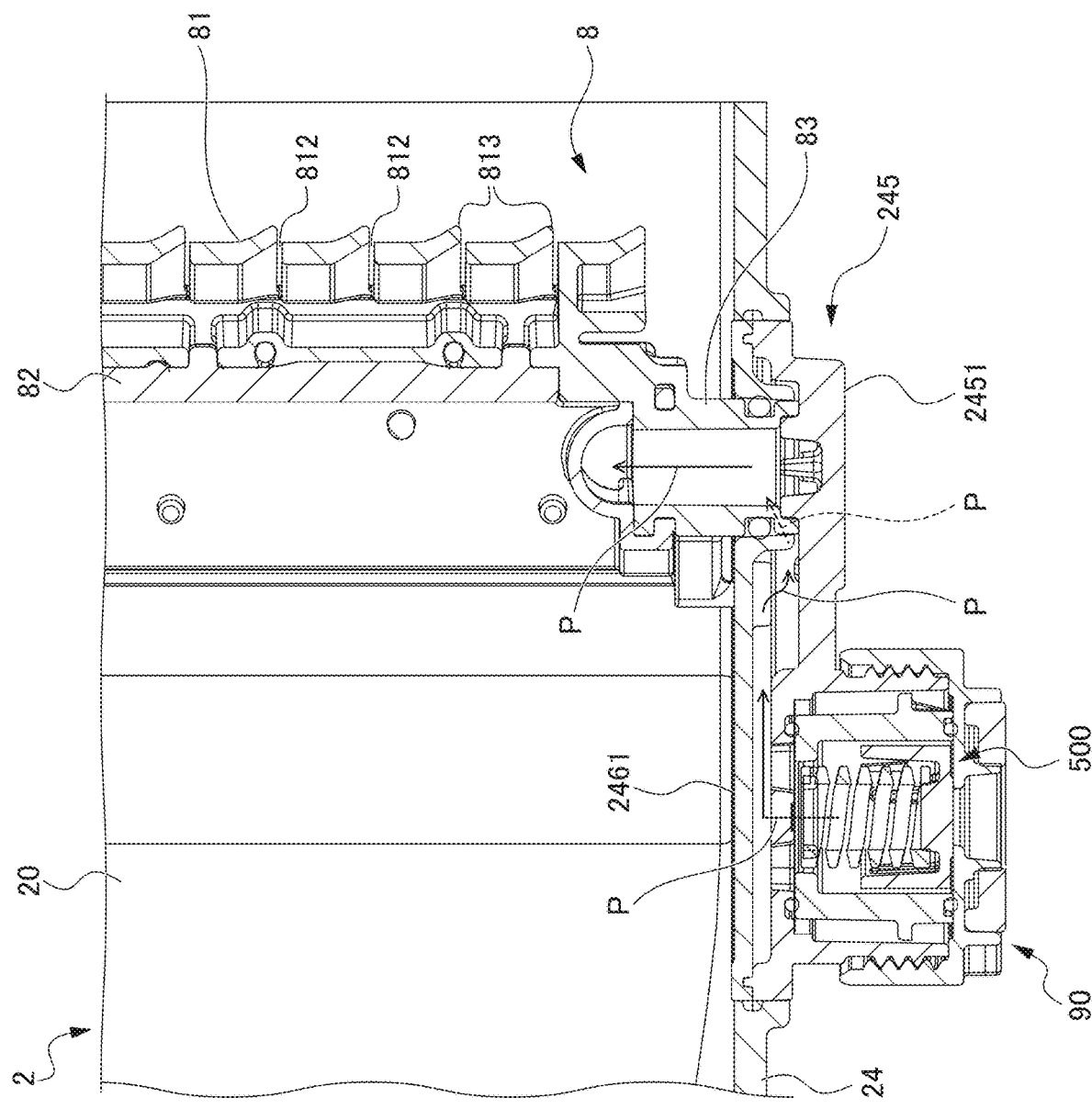
FIG. 5 is an enlarged sectional side view illustrating the container main body 2 of the substrate storing container 1 of the embodiment of the present invention.
Figure 6:
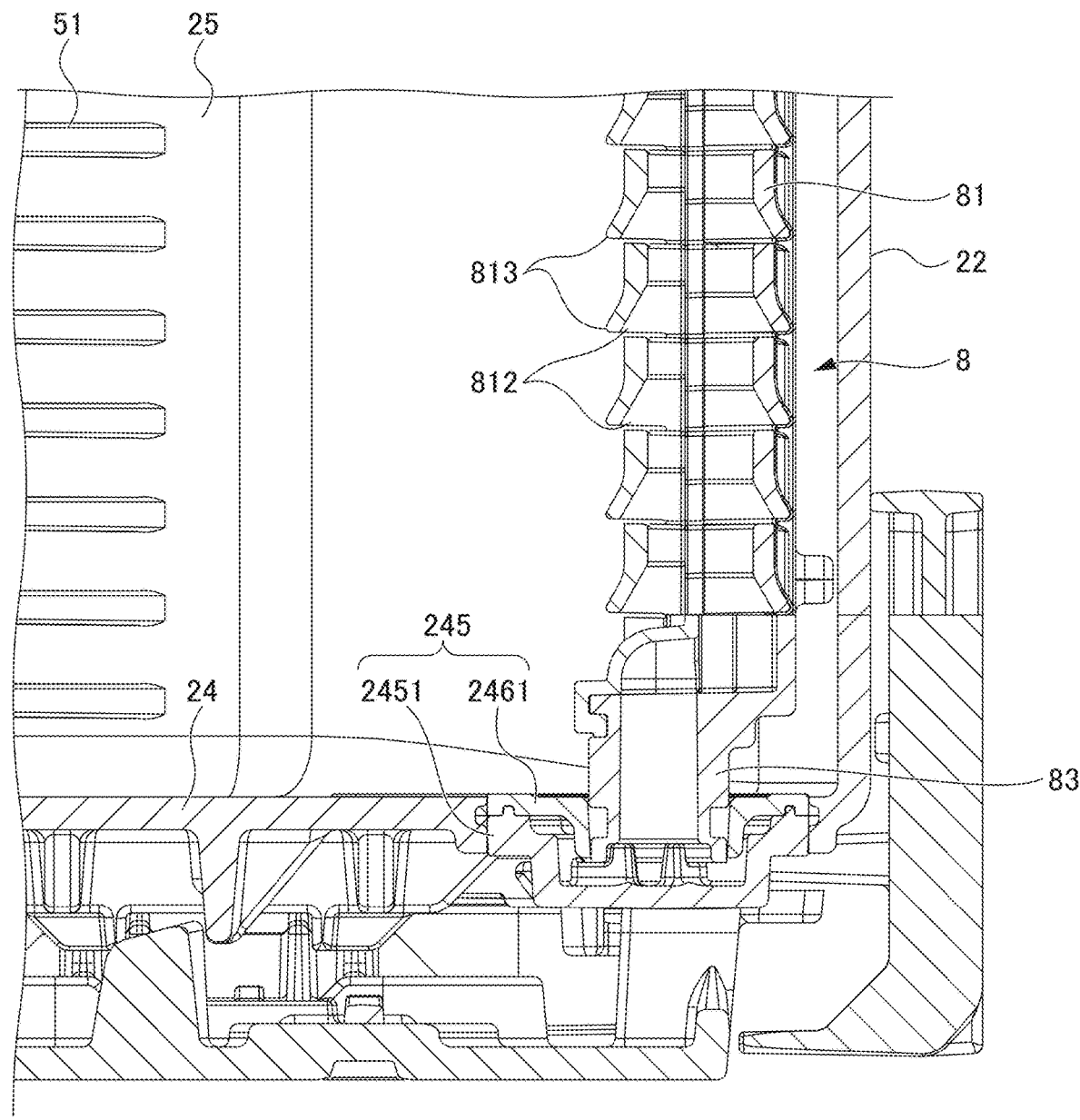
FIG. 6 is an enlarged sectional rear view illustrating the container main body 2 of the substrate storing container 1 of the embodiment of the present invention.
Figure 7:
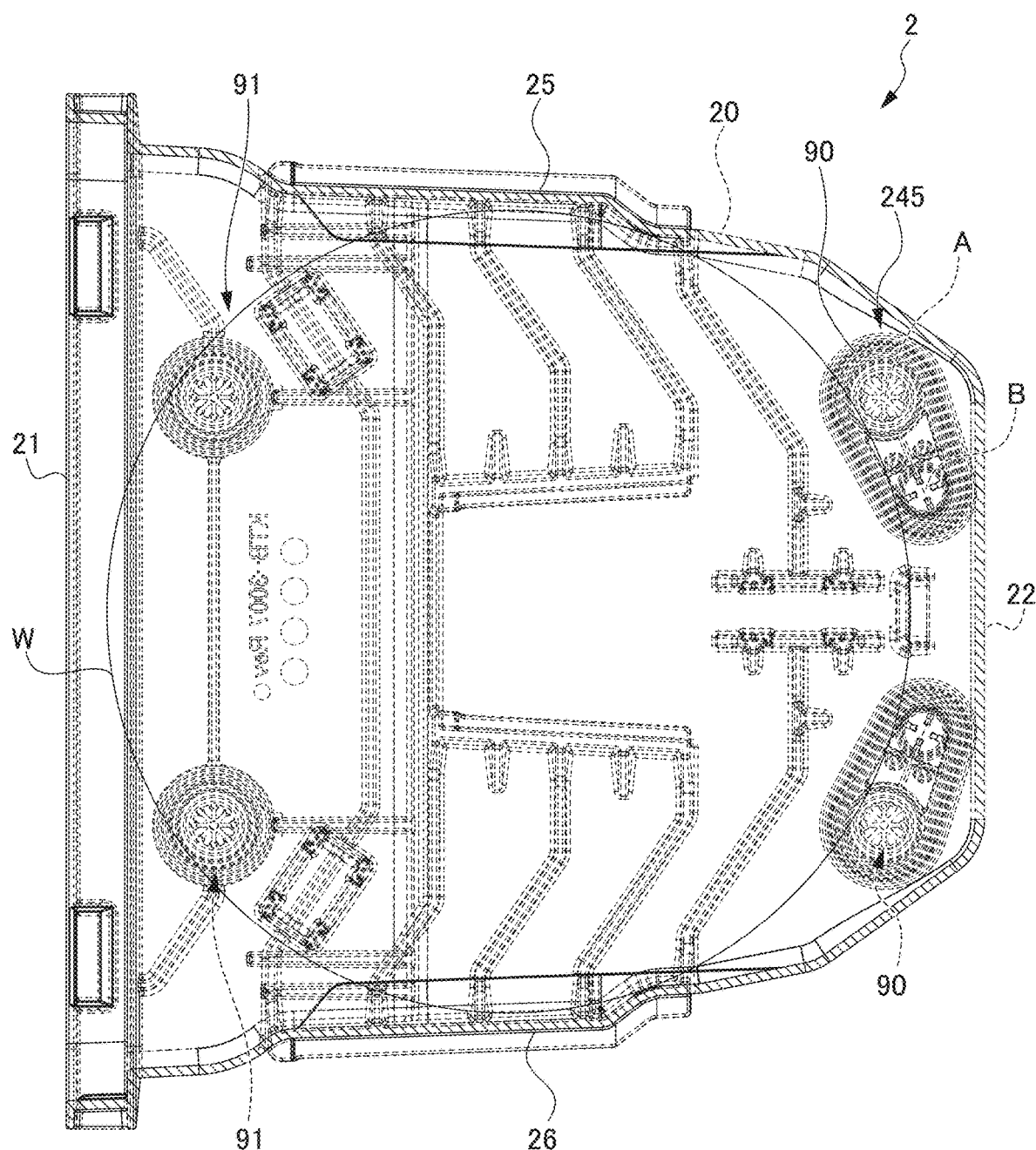
FIG. 7 is a sectional view illustrating the container main body 2 of the substrate storing container 1 of the embodiment of the present invention as seen from above.
Figure 8:
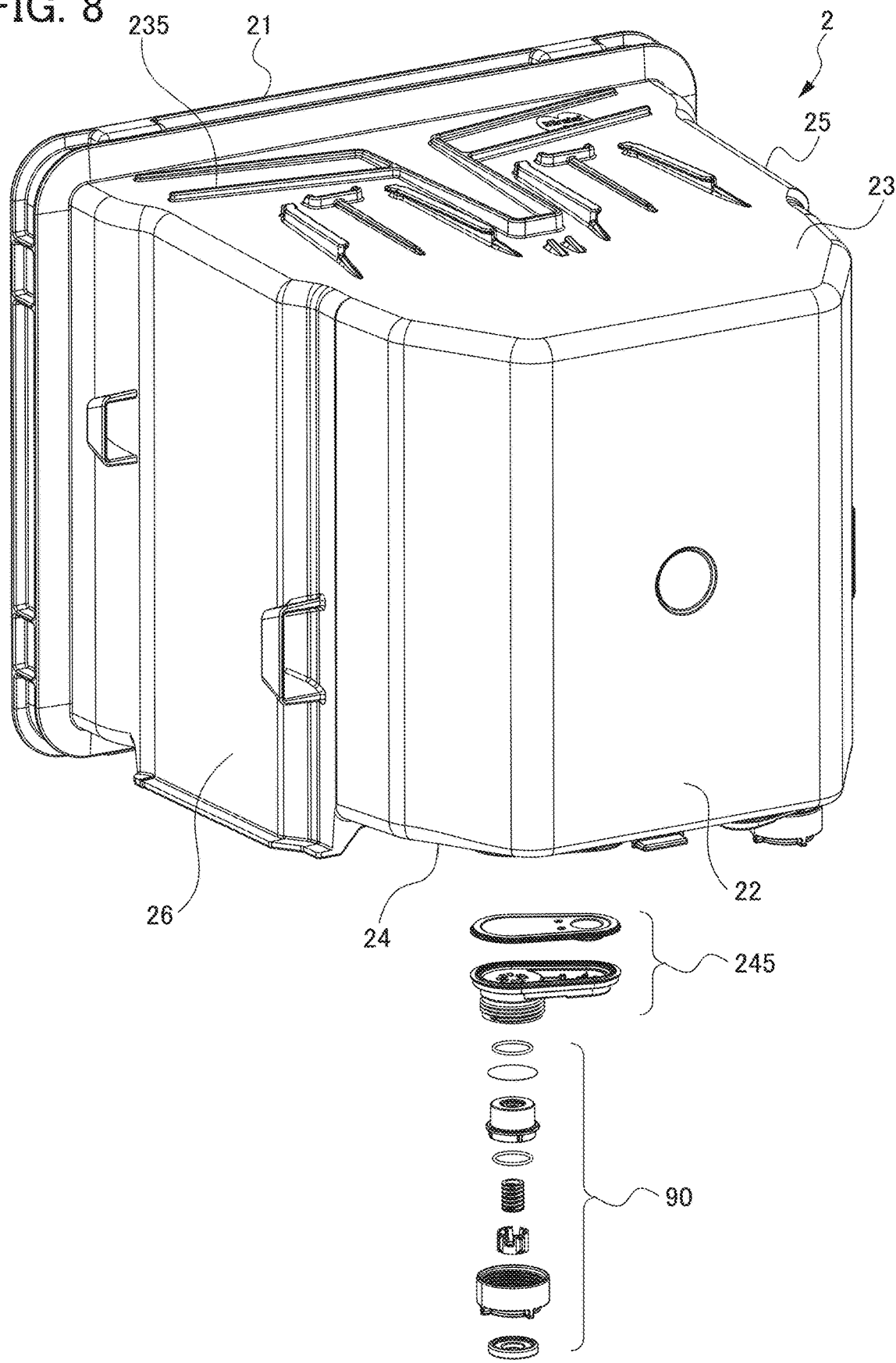
FIG. 8 is an exploded perspective view illustrating the container main body 2, ventilation passage forming unit 245, and inlet filter unit 90 of the substrate storing container 1 of the embodiment of the present invention.
Figure 9:
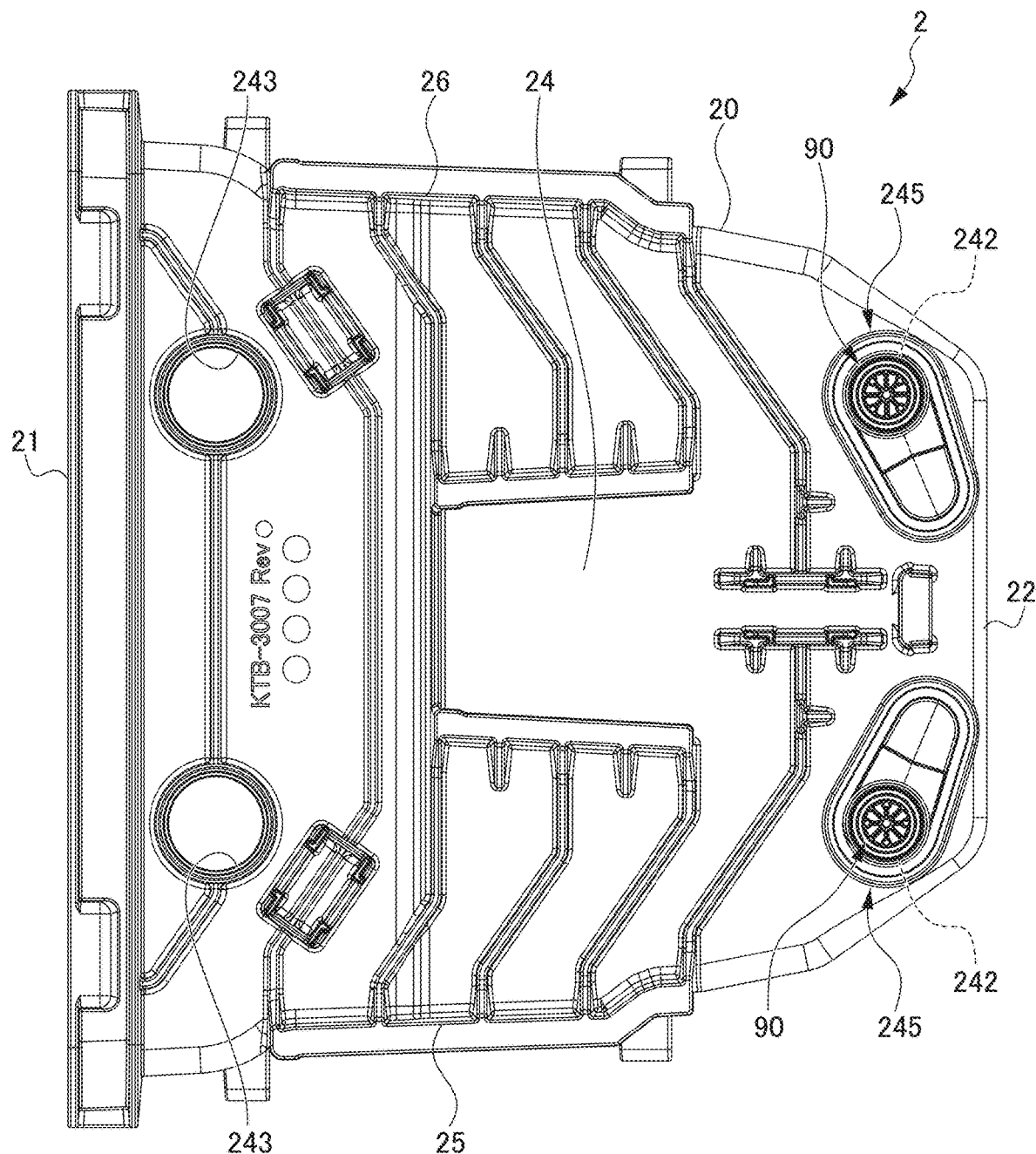
FIG. 9 is a bottom view illustrating the container main body 2 of the substrate storing container 1 of the embodiment of the present invention.
Figure 10:
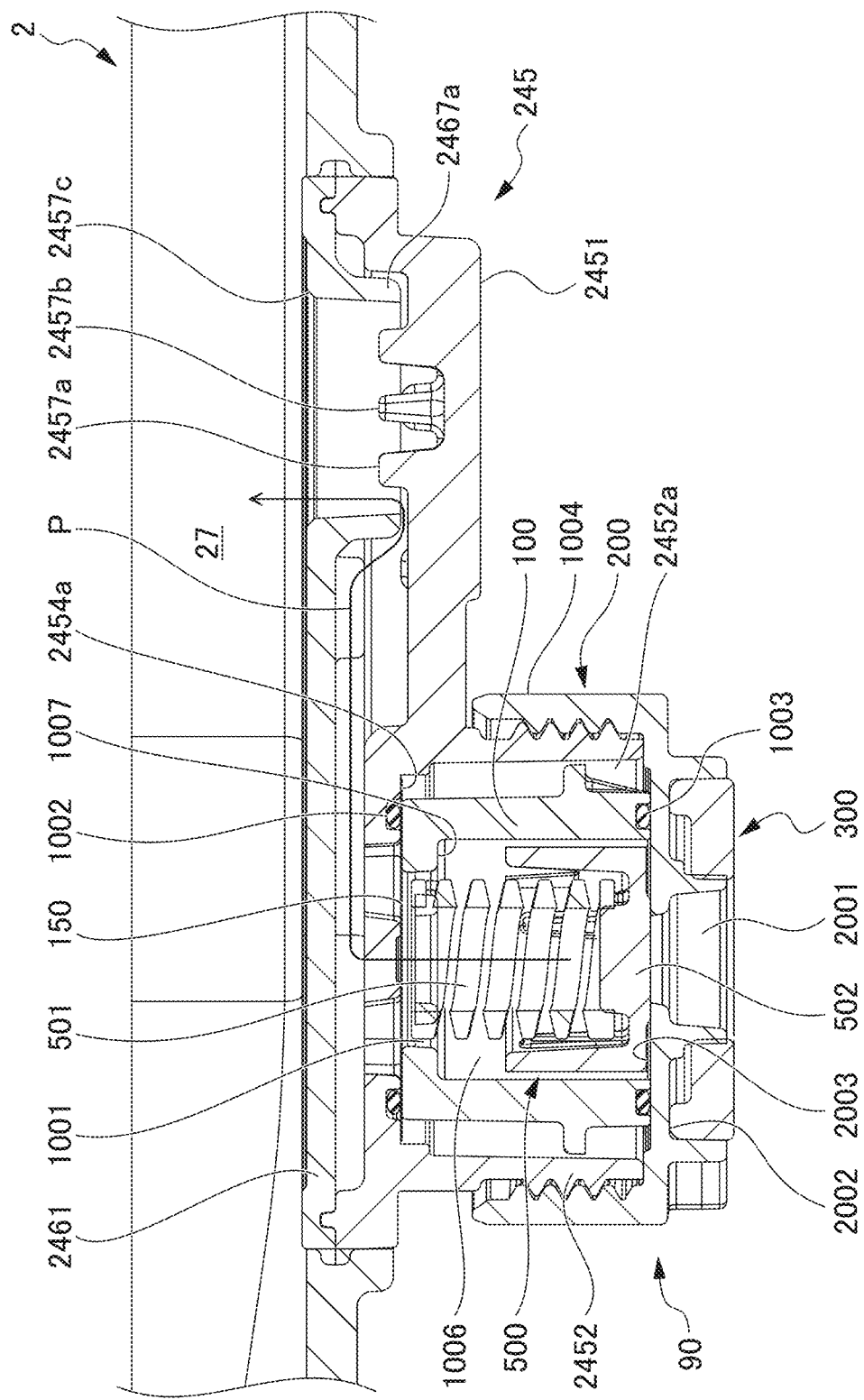
FIG. 10 is an enlarged sectional view illustrating the container main body 2, ventilation passage forming unit 245, and inlet filter unit 90 of the substrate storing container 1 of the embodiment of the present invention.
Figure 11:
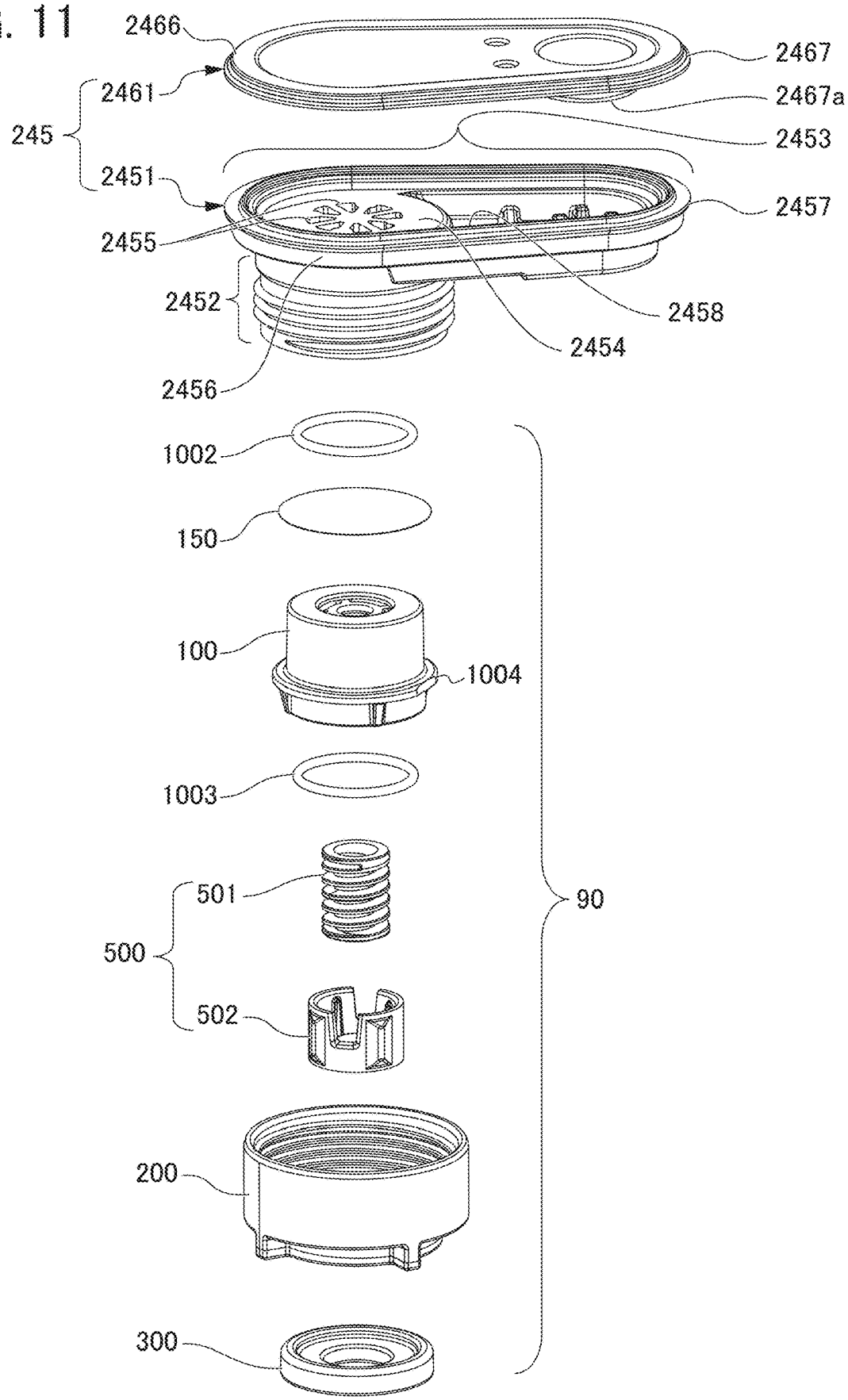
FIG. 11 is an exploded perspective view illustrating the ventilation passage forming unit 245 and inlet filter unit 90 of the substrate storing container 1 of the embodiment of the present invention.

Components will be described in detail below. FIG. 5 is an enlarged sectional side view illustrating the container main body 2 of the substrate storing container 1. FIG. 6 is an enlarged sectional rear view illustrating the container main body 2 of the substrate storing container 1. FIG. 7 is a sectional view illustrating the container main body 2 of the substrate storing container 1 as seen from above. FIG. 8 is an exploded perspective view illustrating the container main body 2, ventilation passage forming unit 245, and inlet filter unit 90 of the substrate storing container 1 of the embodiment of the present invention. FIG. 9 is a bottom view illustrating the container main body 2 of the substrate storing container 1. FIG. 10 is an enlarged sectional view illustrating the container main body 2, ventilation passage forming unit 245, and inlet filter unit 90 of the substrate storing container 1. FIG. 11 is an exploded perspective view illustrating the ventilation passage forming unit 245 and inlet filter unit 90 of the substrate storing container 1.

As illustrated in FIG. 1, the wall portion 20 of the container main body 2 includes a back wall 22, an upper wall 23, a lower wall 24, a first side wall 25, and a second side wall 26. The back wall 22, the upper wall 23, the lower wall 24, the first side wall 25, and the second side wall 26 are configured from the materials described above, and are integrally molded together.

The first side wall 25 faces the second side wall 26, and the upper wall 23 faces the lower wall 24. A rear edge of the upper wall 23, a rear edge of the lower wall 24, a rear edge of the first side wall 25, and a rear edge of the second side wall 26 are all connected to the back wall 22. A front edge of the upper wall 23, a front edge of the lower wall 24, a front edge of the first side wall 25, and a front edge of the second side wall 26 configure the opening peripheral portion 28, which forms the container main body opening portion 21 in a substantially rectangular shape.

The opening peripheral portion 28 is provided at one end portion of the container main body 2, and the back wall 22 is located at the other end portion of the container main body 2. The profile of the container main body 2 formed by outer faces of the wall portion 20 is a box shape. Inner faces of the wall portion 20, i.e. an inner face of the back wall 22, an inner face of the upper wall 23, an inner face of the lower wall 24, an inner face of the first side wall 25, and an inner face of the second side wall 26, form the substrate storing space 27, which is surrounded by these faces. The container main body opening portion 21 formed at the opening peripheral portion 28 is in communication with the substrate storing space 27, which is surrounded by the wall portion 20 and formed inside the container main body 2. The substrate storing space 27 can store a maximum of twenty-five substrates W.

As illustrated in FIG. 1, latch engagement recesses 231A, 231B, 241A, and 241B which are indented outward of the substrate storing space 27 are formed in portions of the upper and lower walls 23 and 24 near the opening peripheral portion 28. The latch engagement recesses 231A and 231B are respectively formed near left and right ends of the upper wall 23, and the latch engagement recesses 241A and 241B are respectively formed near left and right ends of the lower wall 24. That is, the latch engagement recesses, four in total, are formed.

As illustrated in FIG. 1, a rib 235 is integrally molded with the upper wall 23 on the outer face of the upper wall 23. The rib 235 improves the rigidity of the container main body 2. A top flange 236 is fixed to a center portion of the upper wall 23. The top flange 236 is a member of the substrate storing container 1 to be hung and suspended by a conveying device such as an AMHS (Automated Material Handling System) and PGV (Person Guided Vehicle) that suspends the substrate storing container 1.

A bottom plate 244 is fixed to the lower wall 24 as illustrated in FIG. 3. The bottom plate 244 has a substantially rectangular plate shape arranged to face almost the entire lower face, i.e., the outer face, of the lower wall 24, and is fixed to the lower wall 24.

As illustrated in FIG. 3, air inlets 242 and air outlets 243, which are two kinds of through-holes constituting a ventilation passage P, are respectively formed at four corners of the lower wall 24. In the present embodiment, two through-holes on a front side of the lower wall 24 are the air outlets 243 through which gas in the container main body 2 is discharged outside, and two through-holes on a back side are the air inlets 242 through which gas is supplied into the container main body 2.

The two through-holes on the back side are formed in a ventilation passage forming unit 245 which is insert-molded with the container main body 2. Specifically, as illustrated in FIG. 11, the ventilation passage forming unit 245 is an assembly of two members, namely, a container main body connecting part 2451 as a first component that forms a portion through which the gas flows into a ventilation passage of the ventilation passage forming unit 245, and a top plate 2461 as a second component that forms a portion with which the gas that has flowed into the ventilation passage of the ventilation passage forming unit 245 collides to change a flow direction of the gas. In a state where the top plate 2461 is just in contact with, but is not welded to, the container main body connecting part 2451, the ventilation passage forming unit 245 is placed in a molding die for molding the container main body 2, and insert-molded with the container main body 2 to be fixed to the container main body 2.

The container main body connecting part 2451 includes a cylindrical connecting portion 2452 and a horizontal channel forming portion 2453. The cylindrical connecting portion 2452 has a cylindrical shape as illustrated in FIG. 11. An outer peripheral face of a lower portion of the cylindrical connecting portion 2452 is cut to form a male thread. An upper end face 2454 of the cylindrical connecting portion 2452 is positioned below the peripheral edge of the horizontal channel forming portion 2453. The upper end face 2454 of the cylindrical connecting portion 2452 is provided with a plurality of through-holes 2455, and the plurality of through-holes 2455 constitute a ventilation passage.

The horizontal channel forming portion 2453 is substantially oval when viewed in a plan view. One end portion 2456 of the horizontal channel forming portion 2453 in a longitudinal direction thereof has a larger diameter than the other end portion 2457, and an upper end of the cylindrical connecting portion 2452 is integrally molded and connected to the one end portion 2456. A horizontal channel recess 2458 which is indented further downward than the peripheral edge of the horizontal channel forming portion 2453 is formed in an upper face of the horizontal channel forming portion 2453. The horizontal channel recess 2458 is formed to extend from the perimeter of the cylindrical connecting portion 2452 to the other end portion 2457 in the longitudinal direction of the horizontal channel forming portion 2453, and constitutes a ventilation passage which allows the purge gas that has entered the cylindrical connecting portion 2452 to flow in the horizontal direction.

A portion of the horizontal channel forming portion 2453 forming the horizontal channel recess 2458 at the other end portion 2457 in the longitudinal direction of the horizontal channel forming portion 2453 has an annular protrusion 2457a protruding vertically upward in an annular shape as illustrated in FIG. 10. The annular protrusion 2457a has an axial center protrusion 2457b protruding vertically upward from an axial center of the annular protrusion 2457a to a level substantially the same as an upper end of the annular protrusion 2457a.

As illustrated in FIG. 11, the top plate 2461 is formed into a plate shape, and has a substantially oval profile that coincides with the profile of the horizontal channel forming portion 2453 when viewed in plan. One end portion 2466 of the top plate 2461 in a longitudinal direction thereof has a larger diameter than the other end portion 2467, and the upper end face 2454 of the cylindrical connecting portion 2452 faces the one end portion 2466. The other end portion 2467 in the longitudinal direction of the top plate 2461 has a top plate-side annular protrusion 2467a protruding downward in an annular shape. Space inside the top plate-side annular protrusion 2467a communicates with the substrate storing space 27 via a through-hole 2457c formed in the other end portion 2467 in the longitudinal direction of the top plate 2461. The top plate-side annular protrusion 2467a has an axial center that coincides with the axial center of the annular protrusion 2457a of the horizontal channel forming portion 2453. A lower end portion of the top plate-side annular protrusion 2467a is arranged to surround an upper end portion of the annular protrusion 2457a of the horizontal channel forming portion 2453. A lower end portion of a gas spray nozzle unit 8, which will be described later, is fitted between the lower end portion of the top plate-side annular protrusion 2467a and the upper end portion of the annular protrusion 2457a of the horizontal channel forming portion 2453, so that the gas spray nozzle unit 8 is removably fixed and mounted to the ventilation passage forming unit 245.

As indicated by an arrow in FIG. 10, the ventilation passage in the ventilation passage forming unit 245 extends in an axial direction of the cylindrical connecting portion 2452 from a lower end to an upper end of the cylindrical connecting portion 2452 to reach the top plate 2461, and is bent at a right angle to extend toward the other end portion 2467 of the top plate 2461 along the lower face of the top plate 2461. Then, at the other end portion of the top plate 2461, the ventilation passage is bent at a right angle to extend in an axial direction of the top plate-side annular protrusion 2467a to go into the top plate-side annular protrusion 2467a from a lower end of the top plate-side annular protrusion 2467a, and extends in the axial direction of the top plate-side annular protrusion 2467a toward the substrate storing space 27. Thus, the ventilation passage in the ventilation passage forming unit 245 is bent twice at a right angle. Therefore, as illustrated in FIG. 7, in a direction parallel to the front-back direction D1 and the left-right direction D3, a position A at which the purge gas flows into the ventilation passage in the ventilation passage forming unit 245 is different from a position B at which the purge gas flows out of the ventilation passage.

An inlet filter unit 90 is arranged as an additional component at each of the through-holes serving as the air inlets 242, an outlet filter unit 91 is arranged at each of the through-holes serving as the air outlets 243. Specifically, a gas channel formed in the ventilation passage forming unit 245, the inlet filter unit 90, and the outlet filter unit 91 partially constitutes the ventilation passage that allows the substrate storing space 27 and an external space of the container main body 2 to communicate with each other. The inlet filter unit 90 and the outlet filter unit 91 are arranged on the wall portion 20, and the gas can pass between the external space of the container main body 2 and the substrate storing space 27 through the inlet filter unit 90 and the outlet filter unit 91.

As illustrated in FIGS. 10 and 11, the outlet filter unit 90 includes an inner cylindrical member 100, an outer housing 200, a pad 300, and an actuator member 500 which is a check valve mechanism. The outer housing 200 has a substantially cylindrical shape, and a through-hole 2001 is formed in a lower end face thereof. An upper end portion is open upward. An inner peripheral face of the outer housing 200 is cut to form a female thread. As illustrated in FIG. 10, the female thread is screwed with the male thread formed in the outer peripheral face of the lower portion of the cylindrical connecting portion 2452 of the ventilation passage forming unit 245 to be fixed to the lower portion of the cylindrical connecting portion 2452, while covering the lower portion of the cylindrical connecting portion 2452 of the ventilation passage forming unit 245 from below.

As illustrated in FIG. 10, the lower end face of the outer housing 200 is provided with an annular recess 2002, in which the pad 300 is fitted. The inner cylindrical member 100 is arranged in a space inside the outer housing 200. The inner cylindrical member 100 has a substantially cylindrical shape, and a through-hole 1001 is formed in a center portion of an upper end face thereof.

An O-ring 1002 is arranged along the peripheral edge of the upper end face of the inner cylindrical member 100. Via the O-ring 1002, the inner cylindrical member 100 abuts on a lower face 2454a (inner face) of the wall portion constituting the upper end face of the cylindrical connecting portion 2452 of the ventilation passage forming unit 245. Between the lower face 2454a and the inner cylindrical member 100, a filter element 150 is sandwiched and held between a set of the lower face 2454a and the O-ring 1002 and the inner cylindrical member 100. An O-ring 1003 is arranged along the peripheral edge of a lower end face of the inner cylindrical member 100. Via the O-ring 1003, the inner cylindrical member 100 abuts on an upper face 2003 (inner face) of the wall portion constituting the lower end face of the outer housing 200. A flange 1004 protruding radially outward of the inner cylindrical member 100 is formed at an intermediate portion of the inner cylindrical member 100 in the vertical direction. A lower face of the flange 1004 abuts on an upper end face of an inner protrusion 2452a formed at a lower end portion of the inner peripheral face of the cylindrical connecting portion 2452 of the ventilation passage forming unit 245.

The actuator member 500 includes a valve element 502 and a spring 501 that biases the valve element 502 toward a given direction. In a ventilation space 1006 in the inner cylindrical member 100, the valve element 502 is arranged further outward (downward in FIG. 10) of the substrate storing space 27 than the spring 501. The spring 501 is a compression spring, and biases the valve element 502 so that the valve element 502 abuts on the upper face 2003 (inner face) of the wall portion constituting the lower end face of the outer housing 200.

When the valve element 502 abuts on the upper face 2003, the valve is closed. Thus, the ventilation space 1006 in the inner cylindrical member 100 forming the ventilation passage is closed to block the communication between the substrate storing space 27 and the external space of the container main body 2. Conversely, when the purge gas supplied from a tip end of a purging port of a gas purging device (not illustrated) pushes the valve element 502 toward the inside of the substrate storing space 27 (upward in FIG. 10) against the biasing force of the spring 501, the valve element 502 is separated from the upper face 2003, and the through-hole 2001 in the lower end face of the outer housing 200 is opened. Then, the ventilation space 1006 in the inner cylindrical member 100 is no longer closed, thereby allowing the substrate storing space 27 and the external space of the container main body 2 to communicate with each other.

The outlet filter unit 91 provided for the air outlet 243 is configured substantially the same as the inlet filter unit 90 for the air inlet 242, except for the positional relationship between the spring 501 and the valve element 502. In the air outlet 243, the valve element 502 is arranged further inward (e.g., upward in FIG. 10) of the substrate storing space 27 to be vertically inverted relative to the valve 502 in the air inlet 242, and the spring 501 is arranged further outward (e.g., downward in FIG. 10) of the substrate storing space 27 than the valve element 502. The spring 501 biases the valve element 502 so that the valve element 502 abuts on a lower face 1007 of the upper end face of the inner cylindrical member 100.

In this configuration, when the valve element 502 abuts on the lower face 1007, the valve is closed. Then, the ventilation space 1006 in the inner cylindrical member 100 forming the ventilation passage is closed to block the communication between the substrate storing space 27 and the external space of the container main body 2. Conversely, when the gas from the substrate storing space 27 pushes the valve element 502 outward of the substrate storing space 27 (downward in FIG. 10) against the biasing force of the spring 501, the valve element 502 is separated from the lower face 1007, and the through-hole of the ventilation space 1006 is opened. Then, the ventilation space 1006 in the inner cylindrical member 100 is no longer closed, thereby allowing the substrate storing space 27 and the external space of the container main body 2 to communicate with each other.

A gas spray nozzle unit 8 includes, as illustrated in FIGS. 4 to 6, nozzle bodies 81 each having a substantially cylindrical portion with a closed upper end and an open lower end, a gas distribution portion 82 that allows the purge gas to flow into the nozzle body 81, and a connector portion 83 that connects the gas distribution portion 82 and the ventilation passage forming unit 245.

The gas spray nozzle unit 8 is fixed to the other end portion 2457 of the horizontal channel forming portion 2453, and thus, is located further radially outward of the substrates W than the peripheral edges of the substrates W stored in the substrate storing space 27. The nozzle body 81 is provided with openings 812 constituted of through-holes that allow the inside and outside of the gas spray nozzle unit 8 to communicate with each other. The openings 812 of the same number as the substrates W that can be stored in the substrate storing container 1, i.e., twenty-five openings, are arranged in the vertical direction D2 between the upper end portion and lower end portion of the gas spray nozzle unit 8.

The gas spray nozzle unit 8 further includes a cleaning liquid blocking portion. The cleaning liquid blocking portion is configured as an inclined canopy 813 which is arranged near each opening 812, more specifically, above and below the opening 812. The inclined canopy 813 is inclined in the downward direction D22 as it extends away from the nozzle body 81 in a direction parallel to the front-back direction D1 and the left-right direction D3. The inclined canopy 813 extends in the circumferential direction of the nozzle body 81 to cover almost three quarters of the circumference of the nozzle body 81. Likewise, the opening 812 also extends in the circumferential direction of the nozzle body 81 to cover almost three quarters of the circumference of the nozzle body 81. The inclined canopy 813, arranged near the opening 812, blocks the cleaning liquid used to clean the container main body 2 from flowing into the ventilation passage via the opening 812. The inclined canopy 813 constitutes a downward flow guiding portion which allows the gas to flow in the downward direction D22 from the opening 812.

As illustrated in FIG. 2, in the gas spray nozzle unit 8, the nozzle body 81 and another nozzle body 81 paired with each other are connected to the gas distribution portion 82 that can temporarily store the purge gas on the side opposite to the counterpart nozzle body in the left-right direction. A lower end portion of the gas distribution portion 82 is connected to the connector portion 83, and a lower end portion of the connector portion 83 is fitted between the lower end portion of the top plate-side annular protrusion 2467a and the upper end portion of the annular protrusion 2457a of the horizontal channel forming portion 2453, so that the gas spray nozzle unit 8 is removably fixed and mounted to the ventilation passage forming unit 245.

As illustrated in FIG. 2 and other drawings, the substrate support plate-like portions 5 are respectively arranged on the first side wall 25 and the second side wall 26, and are provided in the container main body 2 to form a pair in the left-right direction D3 in the substrate storing space 27. Specifically, each of the substrate support plate-like portions 5 has plate portions 51 as illustrated in FIG. 4 and other drawings.

Each plate portion 51 is formed in a substantially arc shape. The first side wall 25 and the second side wall 26 are respectively provided with twenty-five plate portions 51 arranged in the vertical direction D2, i.e., fifty plate portions in total. The plate portions 51 adjacent to each other are arranged in parallel at intervals of 10 mm to 12 mm in the vertical direction D2.

The twenty-five plate portions 51 on the first side wall 25 and the twenty-five plate portions 51 on the second side wall 26 face each other in the left-right direction D3. Each plate portion 51 has projections 511 and 512. The substrate W supported by the plate portion 51 makes contact with projecting ends of the projections 511 and 512 only, and does not make surface contact with the plate portion 51.

The substrate support plate-like portions 5 configured in this manner can support the edge portions of the plurality of substrates W in a state in which adjacent substrates W are arranged in parallel to be spaced apart by a predetermined interval.

As illustrated in FIG. 4, the back side substrate support portion 6 has back side edge support portions 60. The back side edge support portions 60 are integrally molded with the container main body 2 at the rear ends of the plate portions 51 of the substrate support plate-like portions 5.

The number of the back side edge support portions 60 corresponds to the number of substrates W that can be stored in the substrate storing space 27, i.e., twenty-five back side edge support portions 60 are provided. The back side edge support portions 60 arranged on the first side wall 25 and the second side wall 26 are positioned to form a pair with a front retainer (not illustrated) which will be described later in the front-back direction D1. When the substrates W are stored in the substrate storing space 27 and the lid body 3 is closed, the back side edge support portions 60 sandwich and support the edge portions of the substrates W.

The lid body 3 is formed in a substantially rectangular shape that substantially coincides with the shape of the opening peripheral portion 28 of the container main body 2 as illustrated in FIG. 1 and other drawings. The lid body 3 is removable from the opening peripheral portion 28 of the container main body 2, and can close the container main body opening portion 21 when mounted on the opening peripheral portion 28. On an inner face of the lid body 3 (a rear face of the lid body 3 shown in FIG. 1), an annular seal member 4 is attached at a position that faces a surface of a step portion (a seal surface 281) formed immediately next to the opening peripheral portion 28 in the rearward direction D12 when the lid body 3 closes the container main body opening portion 21. The seal member 4 is made of thermoplastic elastomers such as an elastically deformable polyester elastomer and a polyolefin elastomer, fluorine rubber, or silicone rubber. The seal member 4 is arranged along the entire outer peripheral edge of the lid body 3.

When the lid body 3 is mounted on the opening peripheral portion 28, the seal member 4 is sandwiched and elastically deformed between the seal surface 281 and the inner face of the lid body 3, so that the lid body 3 hermetically closes the container main body opening portion 21. When the lid body 3 is removed from the opening peripheral portion 28, the substrates W can be placed in or taken out of the substrate storing space 27 in the container main body 2.

The lid body 3 is provided with latch mechanisms. The latch mechanisms are provided near the left and right ends of the lid body 3, and include, as illustrated in FIG. 1, two upper latches 32A that can protrude in the upward direction D21 from an upper side of the lid body 3 and two lower latches 32B that can protrude in the downward direction D22 from a lower side of the lid body 3. The two upper latches 32A are arranged near the left and right ends of the upper side of the lid body 3, and the two lower latches 32B are arranged near the left and right ends of the lower side of the lid body 3.

An operating unit 33 is provided on the outer face of the lid body 3. Operating the operating unit 33 from the front of the lid body 3 can cause the upper latches 32A and the lower latches 32B to protrude, or not to protrude, from the upper side and lower side of the lid body 3. When the upper latches 32A protrude in the upward direction D21 from the upper side of the lid body 3 to engage with the latch engagement recesses 231A and 231B of the container main body 2, and the lower latches (not illustrated) protrude in the downward direction D22 from the lower side of the lid body 3 to engage with the latch engagement recesses 241A and 241B of the container main body 2, the lid body 3 is fixed to the opening peripheral portion 28 of the container main body 2.

On the inner side of the lid body 3, a recess (not illustrated) which is indented outward of the substrate storing space 27 is formed. A front retainer (not illustrated) is fixed to the recess (not illustrated) and a portion of the lid body 3 outside of the recess.

The front retainer (not illustrated) has front retainer-side substrate receiving portions (not illustrated). Two front retainer-side substrate receiving portions (not illustrated) are arranged to form a pair to be spaced apart by a predetermined interval in the left-right direction D3. Twenty-five pairs of front retainer-side substrate receivers are arranged in parallel in the vertical direction D2. When the substrates W are stored in the substrate storing space 27 and the lid body 3 is closed, the front retainer-side substrate receiving portions sandwich and support the edge portions of the substrates W.

The substrate storing container 1 of the present embodiment described above can provide the following advantages. As described above, the substrate storing container 1 includes: the container main body 2 including the tubular wall portion 20 having at one end portion thereof the opening peripheral portion 28 at which the container main body opening portion 21 is formed, and the other end portion closed, the container main body 2 having the substrate storing space 27 which is formed by the inner face of the wall portion 20, is able to store a plurality of substrates W, and communicates with the container main body opening portion 21; the lid body 3 which is removably attached to the container main body opening portion 21 and is able to close the container main body opening portion 21; the ventilation passage P which allows the substrate storing space 27 and the external space of the container main body 2 to communicate with each other. The ventilation passage P is formed in the ventilation passage forming unit 245 which is insert-molded with the container main body 2.

According to this configuration, even if a commercially available load port, i.e., a device that positions the container main body 2 and sends the purge gas to the air inlets 242 formed in the outer face of the container main body 2 and communicating with the ventilation passage, has a purging port fixed to a predetermined position, an opening from which the purge gas flows into the substrate storing space 27 can be formed in the container main body 2 at a position not restricted by the position of the purging port. Consequently, the opening from which the purge gas flows into the substrate storing space 27 (the through-hole 2457c formed in the other end portion 2467 in the longitudinal direction of the top plate 2461) can be formed not to be positioned vertically below the substrates W stored in the substrate storing space 27 (not to vertically overlap with the substrates stored in the substrate storing space 27). Thus, irrespective of whether the container main body opening portion 21 of the substrate storing container 1 is closed by the lid body 3 or not, the purge gas can easily flow into the gaps between the substrates W stored in plural number, which improves the efficiency of replacement of the gas present in the gaps.

Since the ventilation passage forming unit 245 is insert-molded with the container main body 2 in advance, the container main body 2 having the ventilation passage forming unit 245 can be improved in dimensional accuracy, which can improve the efficiency of replacement with the purge gas. Further, the structure can be simplified without need of additional components such as an O-ring between the ventilation passage forming unit 245 and the container main body 2.

The ventilation passage forming unit 245 has a single ventilation passage P formed therein. This configuration can cause the purge gas in the ventilation passage forming unit 245 to flow from the outside to inside of the substrate storing space 27.

The ventilation passage forming unit 245 is configured as an assembly of a plurality of components (the container main body connecting part 2451 and the top plate 2461). This configuration can easily provide the ventilation passage P that is bent twice at the right angle in the ventilation passage forming unit 245.

The ventilation passage forming unit 245 includes the container main body connecting part 2451 as a first component that forms a portion through which the gas flows into the ventilation passage P of the ventilation passage forming unit 245, and the top plate 2461 as a second component that forms a portion with which the gas that has flowed into the ventilation passage P of the ventilation passage forming unit 245 collides to change a flow direction of the gas. According to this configuration, the purge gas that has flowed into the container main body connecting part 2451 of the ventilation passage forming unit 245 can collide with the top plate 2461 and change the flow direction of the purge gas at the right angle.

Moreover, the nozzle body 81 as an additional component can be removably attached to the ventilation passage forming unit 245. This configuration allows the additional component such as the nozzle body 81 to be easily attached to the ventilation passage forming unit 245.

It should be noted that the present invention is not limited to the aforementioned respective embodiments, and various modifications thereto are possible within the technical scope described in the claims.

For example, the ventilation passage forming unit 245 is not limited to have a single ventilation passage. The ventilation passage forming unit may include at least a single ventilation passage. Thus, the ventilation passage forming unit may include a plurality of ventilation passages, and may have a plurality of branches of the ventilation passage, for example. Further, the ventilation passage forming unit 245 is configured as an assembly of two components, i.e., the container main body connecting part 2451 and the top plate 2461, but is not limited thereto. The ventilation passage forming unit may be configured as an assembly of a plurality of components, e.g., three components. The nozzle body 81 and the inlet filter units 90 have been described as the additional components that can be removably attached to the ventilation passage forming unit 245. However, the additional components are not limited thereto.

The shapes of the container main body and the lid body, and the number and dimension of the substrates that can be stored in the container main body are not limited to the shapes of the container main body 2 and the lid body 3, and the number and dimension of the substrates W that can be stored in the container main body 2 described in the present embodiment. The substrate W of the present embodiment is a silicon wafer having a diameter of 300 mm, but this value is not limiting.

In the present embodiment, two through-holes on the front side of the lower wall 24 serve as the air outlets 243 through which the gas in the container main body 2 is discharged outside, and two through-holes on the back side serve as the air inlets 242 through which the gas is supplied into the container main body 2. However, the present embodiment is not limited to this configuration. For example, at least one of the two through-holes on the front side of the lower wall may be used as an air inlet through which the gas is supplied into the container main body. This configuration allows the purge gas to be supplied from the lowest position of a front end portion of the container main body.

The back side substrate support portion is not limited to the back side substrate support portion 6 of the present embodiment. For example, a rear retainer integrally molded with the container main body may serve as the back side substrate support portion.

EXPLANATION OF REFERENCE NUMERALS

1 Substrate storing container
2 Container main body
3 Lid body
8 Gas spray nozzle unit
20 Wall portion
21 Container main body opening portion
22 Back wall
90 Inlet filter unit
245 Ventilation passage forming unit
2451 Container main body connecting part (component, first component)
2461 Top plate (component, second component)
A Ventilation passage
W Substrate

The invention claimed is:
1. A substrate storing container, comprising:
a container main body including a tubular wall portion having at one end portion thereof an opening peripheral portion at which a container main body opening portion is formed, and another end portion closed, wherein the container main body having a substrate storing space which is formed by an inner face of the wall portion, is able to store a plurality of substrates, and communicates with the container main body opening portion;
a lid body removably attached to the container main body opening portion and configured to be able to close the container main body opening portion;
a ventilation passage allowing the substrate storing space and an external space of the container main body to communicate with each other; and
a ventilation passage forming unit,
wherein the ventilation passage is formed in the ventilation passage forming unit which is insert-molded with the container main body,
the ventilation passage forming unit is an assembly of a plurality of components, the ventilation passage forming unit comprises:
a first component which is insert-molded with the container main body and forms a portion through which gas flows into the ventilation passage in the ventilation passage forming unit; and
a second component which is insert-molded with the container main body and with which the gas that has flows into the ventilation passage of the ventilation passage forming unit collides to change a flow direction of the gas,
wherein the substrate storing container further comprises:
a gas spray nozzle unit passing through a through-hole formed in the second component and is fixed to the ventilation passage forming unit, and an additional component removably attached to the ventilation passage forming unit,
wherein the additional component is configured as an inlet filter unit, and
the gas spray nozzle unit is fixed to the first component of the ventilation passage forming unit such that the gas spray nozzle unit and the first component hold the second component therebetween.

2. The substrate storing container of claim 1, wherein the ventilation passage forming unit includes at least one of the ventilation passage.

* * * * *